United States Patent
Ramzan et al.

(10) Patent No.: US 12,380,290 B2
(45) Date of Patent: Aug. 5, 2025

(54) FABRIC-BASED RFID TAGS AND METHODS OF MANUFACTURE

(71) Applicant: SML Brand Identification Solutions Limited, Kowloon (HK)

(72) Inventors: Mohammed Ramzan, Halifax (GB); Daniel Smith, Leicestershire (GB)

(73) Assignee: SML BRAND IDENTIFICATION SOLUTIONS LIMITED, Kowloon (HK)

( * ) Notice: Subject to any disclaimer, the term of this patent is extended or adjusted under 35 U.S.C. 154(b) by 0 days.

(21) Appl. No.: 18/691,131

(22) PCT Filed: Sep. 16, 2022

(86) PCT No.: PCT/IB2022/058791
§ 371 (c)(1),
(2) Date: Mar. 12, 2024

(87) PCT Pub. No.: WO2023/042159
PCT Pub. Date: Mar. 23, 2023

(65) Prior Publication Data
US 2024/0403574 A1    Dec. 5, 2024

Related U.S. Application Data

(60) Provisional application No. 63/261,267, filed on Sep. 16, 2021.

(51) Int. Cl.
*G06K 19/077* (2006.01)
*D04B 21/08* (2006.01)
(Continued)

(52) U.S. Cl.
CPC .............. *G06K 1/12* (2013.01); *D04B 21/08* (2013.01); *D04B 21/16* (2013.01); *D04B 21/20* (2013.01);
(Continued)

(58) Field of Classification Search
CPC .... G06K 1/12; G06K 19/07749; D04B 21/08; D04B 21/16; D04B 21/20; D06C 7/02; D10B 2101/20; D10B 2331/04
See application file for complete search history.

(56) References Cited

U.S. PATENT DOCUMENTS 3,646,646 A * 3/1972 Koizumi .................. D02G 1/14
  26/69 R
9,684,864 B1 * 6/2017 Liu ................... G06K 19/07779
(Continued)

FOREIGN PATENT DOCUMENTS

CA    2712602 A1 * 8/2009 ........... G06K 19/025
CN    103548037 A * 1/2014 ....... G06K 19/07749
(Continued)

OTHER PUBLICATIONS

CN 103548037A—RFID tag module and marking process, 12 pages. (Year: 2024).*
(Continued)

*Primary Examiner* — Tuyen K Vo
(74) *Attorney, Agent, or Firm* — Boisbrun Hofman, PLLC (57) ABSTRACT

Disclosed ae fabric-based radio frequency identification (RFID) tags and methods of manufacture. The method is characterized by forming a knitted fabric from at least one primary non-conductive fiber and a secondary conductive fiber, wherein the secondary conductive fiber is distributed within the knitted fabric to form a plurality of dipole antennas; integrating an RFID inlay with each of the plurality of dipole antennas to form pairs of inlays and antennas; and, cutting the knitted fabric to separate each of the pairs of inlays and antennas into individual RFID tags. The RFID inlay comprises an RFID integrated circuit (IC) and a loop antenna on a substrate; the RFID inlay is positioned on
(Continued)

the fabric-based antenna such that the loop antenna is inductively coupled to a dipole antenna.

28 Claims, 5 Drawing Sheets

(51) Int. Cl.
    *D04B 21/16*     (2006.01)
    *D04B 21/20*     (2006.01)
    *D06C 7/02*     (2006.01)
    *G06K 1/12*     (2006.01)

(52) U.S. Cl.
    CPC ......... *D06C 7/02* (2013.01); *G06K 19/07749* (2013.01); *D10B 2101/20* (2013.01); *D10B 2331/04* (2013.01)

(56) References Cited

U.S. PATENT DOCUMENTS

| | | | | |
|---|---|---|---|---|
| 2006/0060657 A1* | 3/2006 | Choong | ........... | G06K 19/07718 235/492 |
| 2006/0125641 A1* | 6/2006 | Forster | ............. | G06K 19/07749 29/601 |
| 2006/0238436 A1* | 10/2006 | Deaett | .................... | H01Q 1/273 343/897 |
| 2010/0323102 A1* | 12/2010 | Chopra | ................ | C09D 11/101 427/125 |
| 2013/0055555 A1* | 3/2013 | Forster | .................... | B32B 38/10 29/847 |
| 2015/0278671 A1* | 10/2015 | Martin | ................. | G06K 19/027 29/601 |
| 2016/0006123 A1* | 1/2016 | Li | ......................... | G06K 19/025 343/867 |
| 2016/0086821 A1* | 3/2016 | West | ................. | G06K 19/07775 438/25 |
| 2019/0266468 A1* | 8/2019 | Kato | ....................... | H01Q 1/273 |
| 2020/0117973 A1* | 4/2020 | Schumacher | .... | G06K 19/07788 |
| 2020/0125909 A1* | 4/2020 | Teitelbaum | ....... | G06K 19/07762 |
| 2020/0342280 A1* | 10/2020 | Mei | .................. | G06K 19/07701 |

FOREIGN PATENT DOCUMENTS

| | | | | |
|---|---|---|---|---|
| DE | 102005008397 A1 | | 9/2006 | |
| EP | 1701298 A2 | | 9/2009 | |
| EP | 3958177 A1 * | | 2/2022 | ........... G06K 19/027 |
| WO | WO-2014053005 A1 * | | 4/2014 | ......... B32B 37/1284 |
| WO | 2017202781 A1 | | 11/2017 | |
| WO | WO-2022037900 A1 * | | 2/2022 | ........... G06K 19/027 |
| WO | 2023042159 A1 | | 3/2023 | |

OTHER PUBLICATIONS

PCT/IB2022/058791 International Search Report and Written Opinion of the ISA dated Nov. 30, 2022, 12 page.

* cited by examiner

FABRIC-BASED RFID TAGS AND METHODS OF MANUFACTURE

RELATED APPLICATION

This application claims the benefit of U.S. Provisional Application No. 63/261,267, entitled "KNITTED RFID TAG AND METHOD OF MANUFACTURE." filed Sep. 16, 2021, which is incorporated herein by reference.

TECHNICAL FIELD

The disclosure is directed, in general, to radio frequency identification (RFID) tags; and, in particular, to fabric-based RFID tags and methods of manufacture thereof.

BACKGROUND

Radio frequency identification (RFID) uses electromagnetic fields to identify and track tags attached to objects. An RFID tag typically consists of three components: an RFID integrated circuit (IC) and antenna(s), both affixed to a substrate. When triggered by an electromagnetic interrogation pulse from an RFID reader device, the tag transmits digital data, usually an identifying inventory number, back to the reader; the number can be used to inventory goods. There are two types of RFID tags; passive tags are powered by energy from an RFID reader's interrogating radio waves, and active tags are powered by a battery and can be read at a greater range from the RFID reader (up to hundreds of meters). Unlike a barcode, an RFID tag does not need to be within the line of sight of the reader, so it may be embedded in the tracked object.

An RFID tag IC has a logic unit that makes decisions and provides memory for stored data, such as a unique product ID. An RFID tag antenna, connected to the tag IC, is the largest part of the tag. The geometry of an antenna is determined by the frequency at which the tag operates; variations in antenna design allow tags to have different properties and behaviors. The antenna can be shaped, for example, as a spiral coil, a single dipole, dual dipoles (one perpendicular to other), or a folded dipole. The antenna is designed for a specific frequency of operation and the designated frequency determines an effective antenna length. A substrate holds the RFID IC and antenna together; conventionally, an antenna is deposited or printed on the substrate, and the IC is then attached to the antenna and the substrate.

One industry for which RFID tags provide great benefits is the garment industry. The ability to tag individual clothing items and track them from manufacture to sale, and even thereafter, enables easy inventory management.

RFID is one of the most promising technological innovations in the field of textiles and clothing; it can, for example, be used in manufacturing, inventory control, warehousing, distribution, logistics, automatic object tracking and supply chain management. RFID technologies can improve the potential benefits of supply chain management through reduction of inventory losses, increase the efficiency and speed of processes and improvement of information accuracy. Although the technology has existed for years, certain technological challenges and cost issues are still major hurdles for the widespread use of RFID.

Although RFID technology has already been applied effectively, there are certain technological barriers that still need to be overcome to optimize its application. These include costs and durability. The RFID tags must first be available at a sufficiently low cost to drive industry use; particularly for lower cost items. Secondly, many of the potential benefits of RFID tags for garments are not realized until after purchase, when a garment will be exposed to conditions that can damage the RFID tag, such as when laundered. Thus, RFID tags, or labels, must be sufficiently durable and impervious to moisture or harsh chemicals, such as laundry detergents.

SUMMARY

To address certain deficiencies of the prior art, disclosed herein are fabric-based RFID tags and methods of manufacture thereof. The method is characterized by forming a knitted fabric from at least one primary non-conductive fiber and a secondary conductive fiber, wherein the secondary conductive fiber is distributed within the knitted fabric to form a plurality of dipole antennas; integrating an RFID inlay with each of the plurality of dipole antennas to form pairs of inlays and antennas; and, cutting the knitted fabric to separate each of the pairs of inlays and antennas into individual RFID tags. The knitted fabric is preferably a Raschel knit and preferably comprises a ribbon wherein pairs of inlays and antennas are distributed at regular intervals along the ribbon; separating the pairs of inlays/antennas comprises cutting the ribbon at regular locations between the pairs. The RFID inlay comprises an RFID integrated circuit (IC) and a loop antenna on a substrate; integrating an RFID inlay with each of the plurality of dipole antennas comprises positioning each RFID inlay such that the loop antenna is inductively coupled to a dipole antenna.

In an exemplary embodiment, the step of forming a knitted fabric further comprises a tertiary fiber that defines registration marks distributed at regular intervals along the ribbon; the registration marks are advantageously utilized to define locations for adhering the RFID inlays to each of the dipole antennas. In related embodiments, the RFID inlay comprises an RFID integrated circuit (IC) and a loop antenna on a substrate. The substrate of each RFID inlay can comprise polyethylene terephthalate (PET) and, in an exemplary embodiment, has a thickness of substantially 50 microns. The loop antenna can, for example, comprise aluminium.

An RFID inlay can be integrated with each of the plurality of dipole antennas by bonding the RFID inlay to the knitted fabric using an adhesive, sewing, micro-welding, or a combination of one or more such means. The step of integrating an RFID inlay with each of the plurality of dipole antennas comprises positioning each RFID inlay such that the loop antenna is inductively coupled to a dipole antenna; the registration marks are advantageously utilized to properly align each RFID inlay with a corresponding dipole antenna.

In an exemplary embodiment, the RFID inlay further comprises at least one of a moisture barrier layer and a heat resistant layer overlaying the RFID IC and loop antenna. The at least one moisture barrier can, for example, be 100 micron cast polypropylene, which is moisture resistant, and the heat resistant layer can be 25 micron polyimide, which is heat resistant.

In exemplary embodiments, the primary non-conductive fiber comprises polyester, which can be a yarn. The secondary conductive fiber can, for example, comprise aluminium. In a related embodiment, the method can further comprise the step of heat-setting the knitted fabric, which can be performed by passing the knitted fabric between a pair of hot rollers under an applied pressure. In a preferred embodiment, the step of heat-setting the knitted fabric is performed prior to the step of adhering an RFID inlay to each of the dipole antennas.

The foregoing has broadly outlined the essential and optional features of the various embodiments that will be described in detail hereinafter; the essential and certain optional features form the subject matter of the appended claims. Those skilled in the art should recognize that the principles of the specifically disclosed fabric-based RFID tags, and methods of manufacture thereof, can be utilized as a basis for similar tags and methods of manufacture that are within the scope of the appended claims.

BRIEF DESCRIPTION OF THE DRAWINGS

For a complete understanding of the present disclosure, reference is now made to the following detailed description taken in conjunction with the accompanying drawings, in which:

FIGS. 6-A and 6-B illustrate performance of the knitted RFID tag illustrated in FIG. 5 as compared to a conventional fabric-based RFID tag;

Unless otherwise indicated, corresponding numerals and symbols in the different figures generally refer to corresponding parts or functions.

DETAILED DESCRIPTION

Conventional RFID tags, or labels, utilize a substrate to support an integrated circuit (IC) and one or more antennas. A substrate can be made from flexible material such as thin plastic, but it may also be made from rigid material. Suitable materials for a substrate include polymer, PVC, polyethylene terephthalate (PET), phenolics, polyesters, styrene, and even paper. RFID tags have also been constructed with a fabric substrate; for such fabric-based RFID tags, the antenna has been sewn into a typically woven fabric.

Knitting is the production of fabric by employing a continuous fiber (e.g., thread or yarn), or set of threads, to form a series of interlocking loops. Knit fabrics can generally, but not always be stretched to a greater degree than woven fabrics. The two basic types of knits are the weft knits—including plain, rib, purl, pattern, and double knits—and the warp knits—including tricot. Raschel, and Milanese. Most weft knits can be made by hand or machine, although commercial fabrics are generally machine-made. Some weft knits are fragile and runs can occur when one loop breaks, releasing other loops in the same row. Weft knits are also generally elastic; i.e., subject to being stretched. Warp knits, in contrast to weft knits, are produced only by machine.

The inventors have recognized that a knitted fabric offers many advantages over prior art types of fabric-based RFID tags, both in the performance characteristics of the end product and the method of manufacture. In particular, a Raschel knit offers particular advantages for RFID tags. Raschel knitting produces an openwork fabric resembling crochet. Raschel knitting machines produce a wide selection of fabrics ranging from mesh bags and net fabrics such as mosquito netting, chemical fiber garments and technical and medical net textiles to lace curtains and edgings, veils, narrow tapes and blankets. Raschel knitting is an industrial knitting process and is not done by hand. Raschel knitting machines produce both flat and tubular warp knit fabrics that resemble crochet and lace fabrics. Raschel knit material can contain inlaid yarns in addition to the vertical rows of stitches. The fabrics are similar to tricot knitting but more open and with a coarser texture. Warp knit fabrics, such as Raschel knits, have greater dimensional stability than weft knit materials and are less likely to sag, nor do they ravel as easily. Raschel warp knit machines generate fabrics in more diverse textures and designs than tricot warp knit machines. Some materials are single-faced; others are reversible. Raschel knitting machines use a wide variety of yarns, ranging from smooth, tightly-spun yarns to novelty yarns. The resultant fabrics vary greatly from lightweight lace to heavy chenille, from fancy embroidery to coarse texture. They tend to have little stretch and hold their shapes well.

Figure 1:
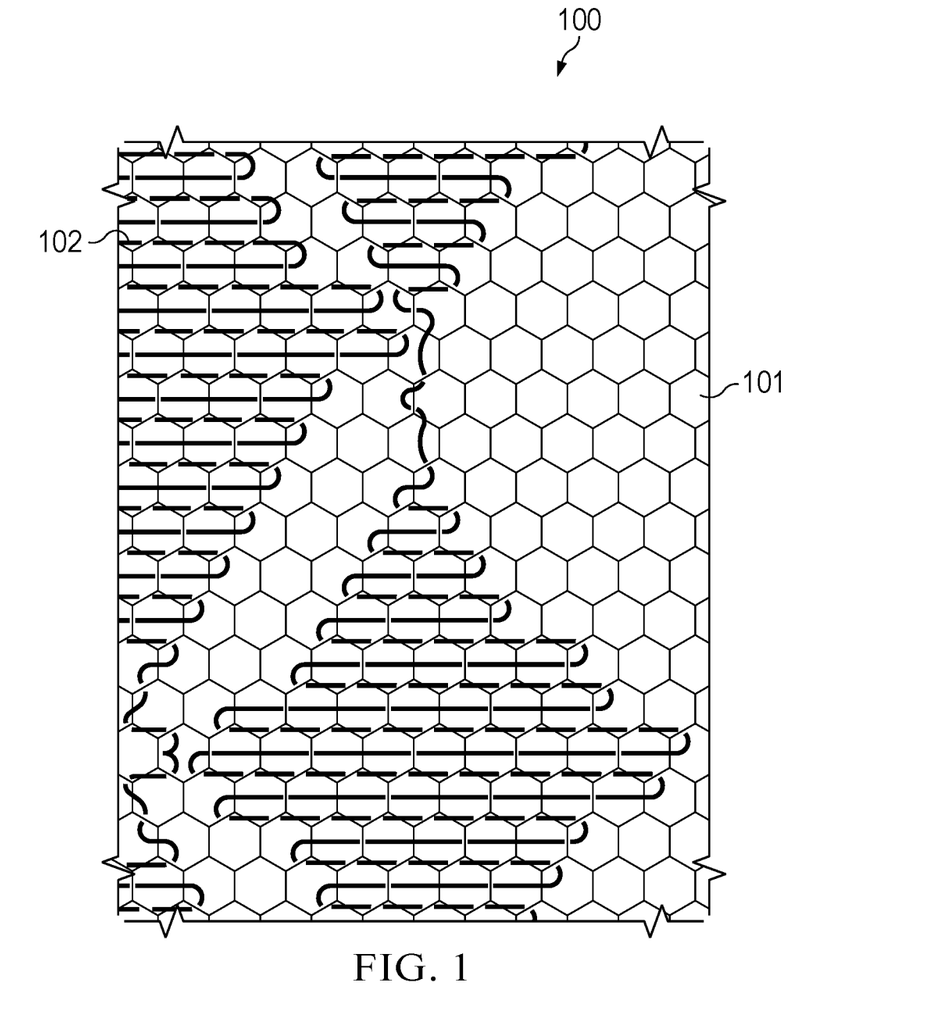
FIG. 1 illustrates an exemplary Raschel knit fabric.

FIG. 1 illustrates an exemplary Raschel knit fabric 100. The exemplary Raschel knit fabric 100 includes primary yarn 101 that forms a lacelike structure and additional warp yarn 102 added to produce designs in the fabric; the additional warp yarn 102 can be added for strength but is usually for aesthetic reasons. The designs created by the additional warp yarn 102 are generally basic as their paths are limited to just left or right as they run down the length of the fabric. A Raschel knit fabric, however, is ideally suited to be the foundation of a fabric-based RFID label.

A knitted fabric, in particular a Raschel knit, can be manufactured with an integral RFID antenna as an inlaid yarn (i.e., an additional warp yarn), wherein the inlaid yarn forming the antenna is made of an electrically conductive fiber. Electrically conductive fibers can be produced by several methods: dispersing carbon particles or other antistatic agents in polymer melts prior to extrusion, depositing carbon (epitropic fibres) or metallic (for example nano-silver) coatings onto fiber surfaces (for example Ni, CuS), incorporating hydrophilic comonomers, and by fabricating fibers from stainless steel, aluminium or other metals. Unlike some conventional fabric-based RFID labels, the RFID antenna can be integrated in the fabric as it is knitted, rather than subsequently being stitched into a fabric substrate. The number of pieces manufactured per machine can be greater than any weaving machine, which leads to better production speeds and output at reduced cost. Although braided fabrics can be very basic and low cost, all yarns are oriented diagonally, so it is not possible to form an antenna having straight lines within the fabric as it is braided. In contrast to a knitted fabric, in particular a Raschel knit, woven fabric substrates for RFID tags are denser (i.e., of higher thread count) and take longer to produce; thus, they are more costly than what is possible using a knitted material as disclosed herein.

Figure 2:
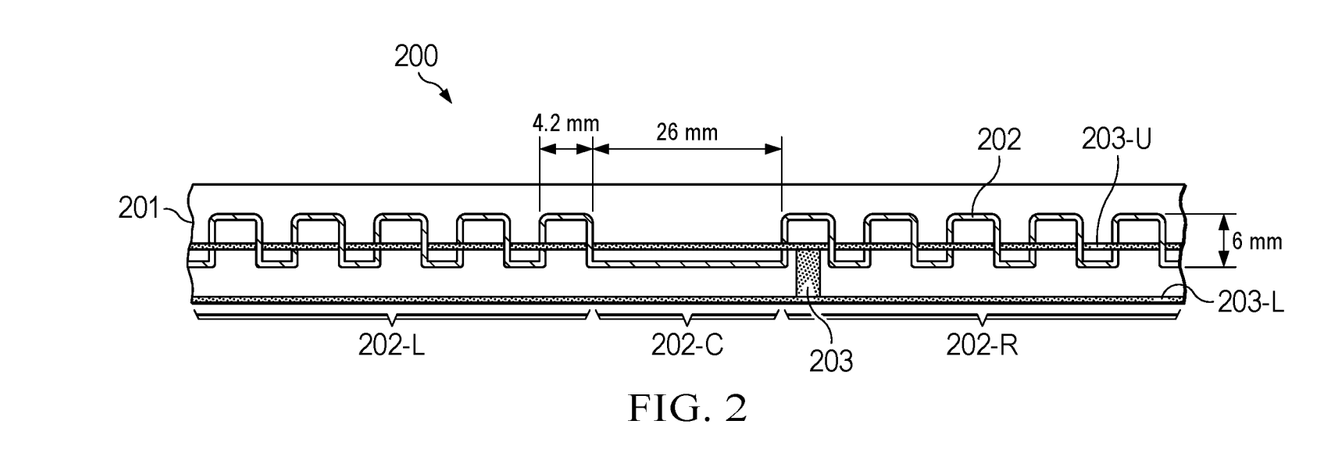
FIG. 2 illustrates an exemplary embodiment of a fabric-based RFID antenna.

FIG. 2 illustrates an exemplary embodiment of a fabric-based RFID antenna 200, based on the use of a Raschel knit substrate. The fabric-based RFID antenna 200 comprises a knitted fabric formed from at least one primary non-conductive fiber 201 (e.g., such as the primary yarn 101 of the Raschel knit fabric illustrated in FIG. 1) and a secondary conductive fiber 202 (e.g., such as the additional warp yarn 102 of the Raschel knit fabric illustrated in FIG. 1); the secondary conductive fiber is distributed within the knitted fabric to form a plurality of dipole antennas (one shown). Each dipole antenna comprises a central region 202-C and left and right dipole antenna legs 202-L, 202-R. The central region 202-C provides a mounting location for an RFID inlay as described hereinafter with reference to FIGS. 3-4.

In the exemplary embodiment illustrated in FIG. 2, the fabric-based RFID antenna 200 is formed as a ribbon wherein dipole antennas are distributed at regular intervals along the ribbon. In such embodiments, as illustrated, the dipole antenna legs 202-L and 202-R can be folded in order to reduce the total length of each RFID antenna 200.

The RFID antenna 200 can further include a tertiary fiber that defines registration lines or marks distributed along the ribbon; the registration lines or marks can be optically sensed by the manufacturing apparatus. As illustrated in FIG. 2, the tertiary fiber forms a registration mark 203 sited at a common location for each dipole antenna; the registration mark provides a point of reference for mounting an RFID inlay in the central region 202-C of the dipole antenna, and those skilled in the art will recognize that it can be located at any common position equidistant from the desired mounting position of the RFID inlay, which may vary depending on the manufacturing apparatus. As also shown in FIG. 2, the tertiary fiber also forms upper and lower registration lines 203-U, 203-L, which run continuously along the length of the ribbon.

Figure 3:
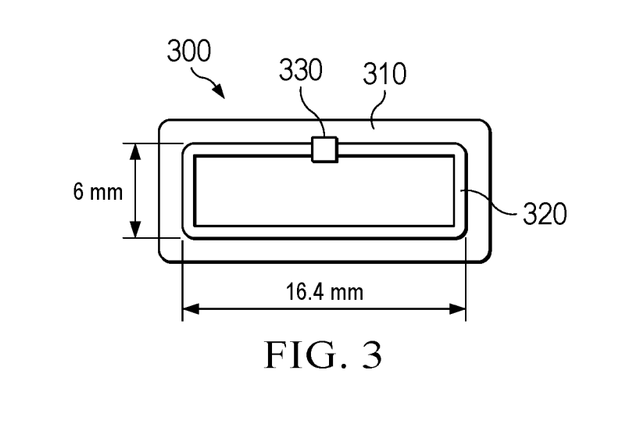
FIG. 3 illustrates an exemplary RFID inlay.

Turning now to FIG. 3, illustrated is an exemplary RFID inlay 300. The RFID inlay 300 is formed by a substrate 310 on which a loop antenna 320 is formed and an RFID integrated circuit (IC) 330 is mounted and electrically coupled to the antenna. The substrate can be, for example, a 50 micron (0.05 mm) thick layer of PET (polyethylene terephthalate) plastic sheet; the PET layer acts as the base substrate (carrier) for the loop antenna 320, which can be formed as a 10 micron (0.01 mm) thick layer of aluminum. The aluminum layer is patterned in such a way to form an RF antenna capable of matching the impedance of the RFID IC 330 and maximizing the reception of radio waves of a desired frequency. For the exemplary inlay illustrated in FIG. 3, the antenna size and geometry are designed for operation at UHF frequencies (860 MHz-960 MHz). The RFID IC 330 can be mounted to the substrate 310 and electrically connected to the loop antenna 330 using conductive adhesive.

In some embodiments, it can be desired to protect the RFID inlay 300 against moisture or other potential contaminants, as well as heat that might be encountered during laundering or ironing. A protected inlay can be formed, for example, by covering the loop antenna 320 and RFID IC 330 with a 100 micron thick layer of cast polypropylene, which is moisture resistant, and a 25 micron thick layer of polyimide, which is heat resistant. In a preferred embodiment, RFID inlay 300 is sandwiched between upper and lower layers of both the cast polypropylene and polyimide.

Figure 4:
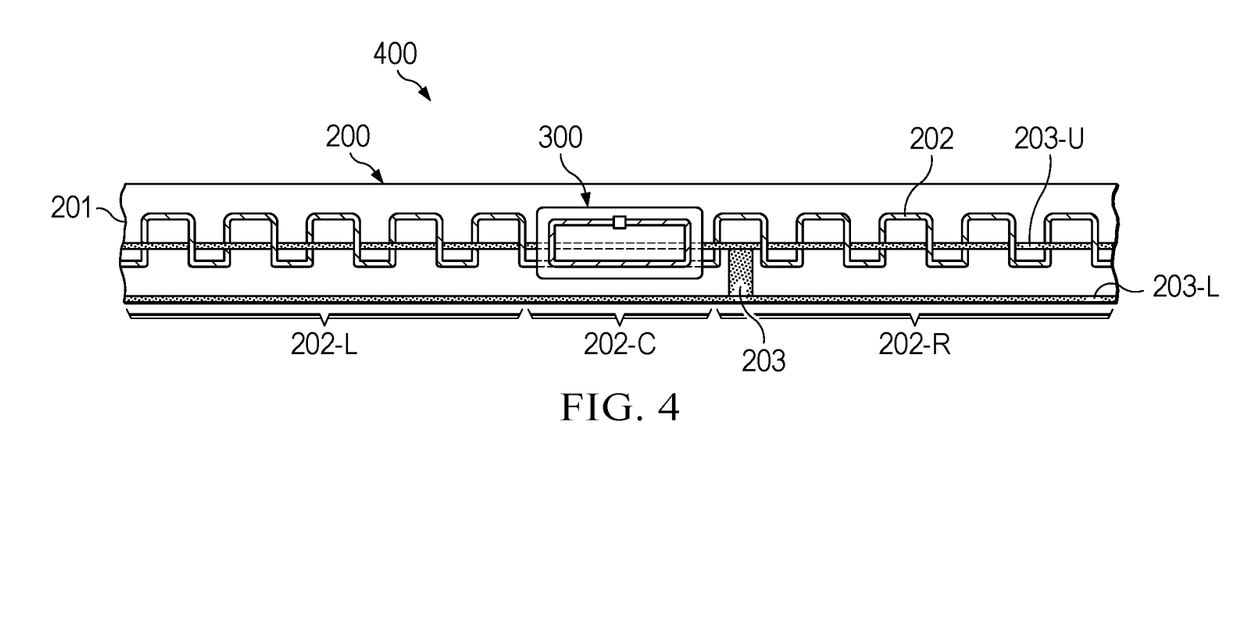
FIG. 4 illustrates a model of a knitted RFID tag.
Figure 5:
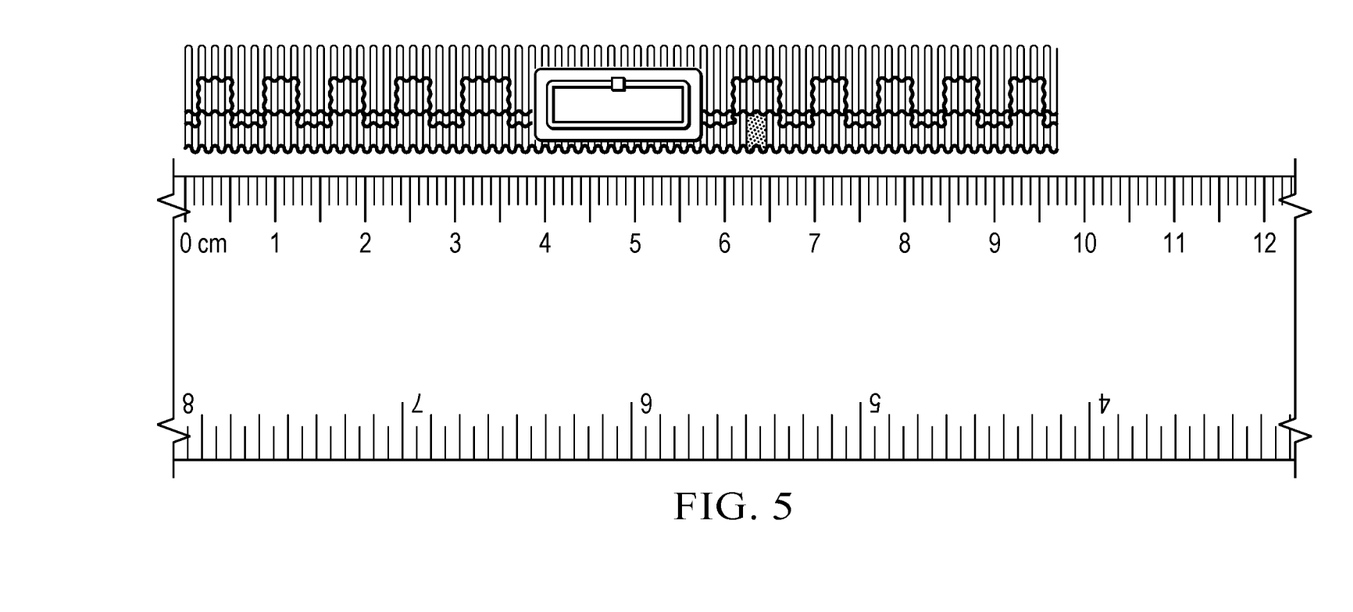
FIG. 5 illustrates an actual assembled knitted RFID tag.

Referring now to FIG. 4, illustrated is a model of a knitted RFID tag 400 constructed from a fabric-based RFID antenna 200 and an RFID inlay 300; FIG. 5 illustrates an actual assembled knitted RFID tag 500, with a scale to show the dimensions, which can be manufactured according to the following exemplary steps:

1. With reference to FIG. 2, producing a fabric-based RFID antenna 200 formed by a knitted fabric of at least one primary non-conductive fiber 201 (e.g., polyester) and a secondary conductive fiber 202 (e.g., aluminium), the secondary conductive fiber being distributed within the knitted fabric to form a plurality of dipole antennas. The knitted fabric is preferably, but not necessarily, a Raschel knit, and is preferably formed as a ribbon having dipole antennas regularly distributed along the length thereof. The fabric-based RFID antenna 200 also, preferably, includes a tertiary thread 203 that defines registration lines/marks in the finished antenna; the registration marks are suitably arranged to guide the mating of an RFID inlay 300 with each dipole antenna in a subsequent step. The dimensions shown in FIG. 2 are the "apparent" dimensions (as seen from perpendicular to surface); the "effective" (or "actual") dimensions of the conductive fiber 202 will always be slightly greater since the fiber goes in-and-out of the knitted fabric.

2. In an optional step, the integrated RFID substrate/antenna fabric can undergo a 'heat-setting process', whereby it passes between a set of hot rollers under some applied pressure; the heat-setting process can "fix" the structure of the knitted fabric so that it doesn't change over time; especially when exposed to moisture or extreme temperatures.

3. With reference to FIG. 3, producing an RFID inlay 300 comprising a loop antenna 320 and RFID IC 330 on a substrate 310; the substrate preferably consists of PET, and the loop antenna is aluminium. This step is independent of step 1 and step 2 (if performed), and can be performed prior or subsequent thereto, or in parallel.

4. Integrating an RFID inlay 300 (from Step 3) with each dipole antenna 202 (from step 1; and, optionally, step 2). This can be a continuous process of marrying an RFID inlay 300 to each dipole antenna 202 regularly distributed along a knitted ribbon as produced in step 1. Suitable means of integration include adhesive, sewing, micro-welding, or a combination of one or more such means. The registration threads/marks optionally included in step 1 can be utilized to appropriately align each RFID inlay 300 with each dipole antenna 202 distributed along the ribbon 200; appropriate alignment requires that the loop antenna 320 of each RFID inlay 300 is inductively coupled to the central region 202-C of a dipole antenna formed by the conductive fiber 202 of the fabric-based RFID antenna 200.

Figure 6:
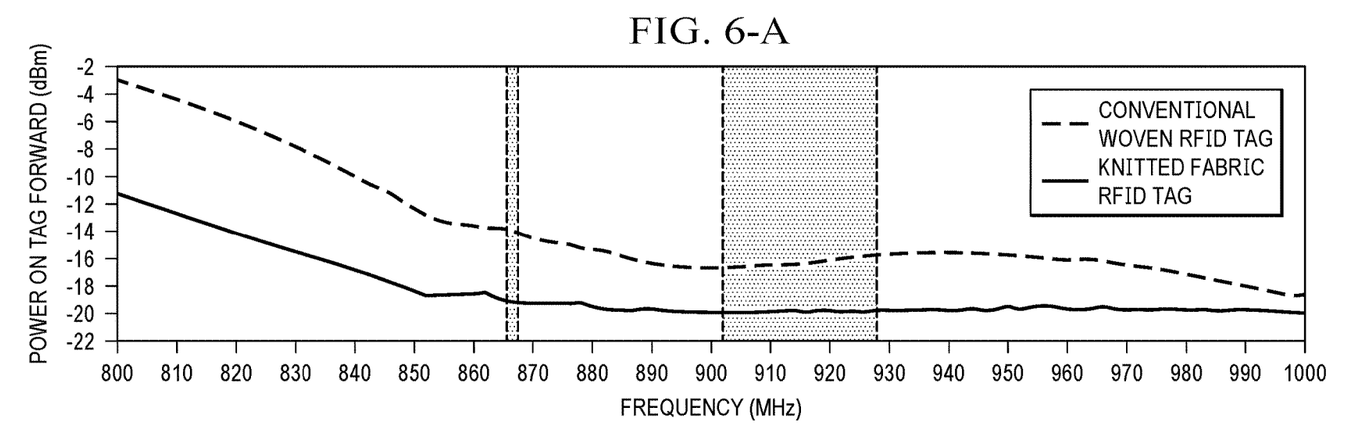

Finally, reference is made to FIGS. 6-A and 6-B, which illustrate the performance of the knitted RFID tag 500 illustrated in FIG. 5 as compared to a conventional fabric-based RFID tag. As can be seen in FIG. 6-A, the free-space receive sensitivity of the knitted RFID tag 500 is at least 5 dB and 3 dB better than a conventional woven RFID tag in ETSI (European; 865-868 MHz) and FCC (North American; 902-928 MHz) UHF RFID bands, respectively. Also, considering the total graphical profiles, the knitted RFID tag 500 has a significantly larger bandwidth compared to the woven RFID tag. The increased bandwidth not only enables the tag to be used across all global UHF RFID regions, but also across a much more diverse range of material types—ranging from thin fabrics to thick denims, as well as thick textile carpets. As can be seen in FIG. 6-B, the free-space read range of the knitted RFID tag 500 exhibited 81% and 44% increased read range compared to the conventional woven tag in ETSI (European) and FCC (North American) UHF RFID bands, respectively. Those skilled in the art will recognize that the significantly larger bandwidth of the knitted RFID tag 500 is evident where a sustained read range of over 14 meters can be observed across the majority of the tested spectrum.

The foregoing has outlined essential and optional features of a knitted RFID tag 400 according to the principles of the invention. The novel design has been tested and shown to have favorable performance over conventional fabric-based RFID tags, as illustrated in FIGS. 6-A and 6-B. In addition to poorer performance, the conventional designs for fabric-based RFID tags are also more difficult to manufacture and, thus, more expensive. The novel design disclosed herein also lends itself to better RF coupling between the RFID inlay and the dipole antenna of the integrated RFID substrate/antenna. The disclosed devices and methods are provided to illustrate the essential and optional features and functions, and those skilled in the art may conceive of alternatives or modifications that do not depart from the principles of the invention as encompassed by the appended claims, and that such alternatives or modifications may be functionally equivalent.

We claim:

1. A method of manufacturing fabric-based radio frequency identification (RFID) tags, comprising the steps of:
   forming a knitted fabric from a primary non-conductive fiber, a secondary conductive fiber and a tertiary fiber as a ribbon, said secondary conductive fiber being distributed within said knitted fabric to form a plurality of dipole antennas, said tertiary fiber defining registration marks between an upper registration line and a lower registration line along said ribbon;
   integrating an RFID inlay with each of said plurality of dipole antennas at said registration marks to form pairs of RFID inlays and dipole antennas distributed at regular intervals along said ribbon; and
   cutting said knitted fabric to separate each of said pairs of RFID inlays and antennas into individual RFID tags.

2. The method recited in claim 1, wherein said knitted fabric is a Raschel knit.

3. The method recited in claim 1, further comprising heat-setting said knitted fabric.

4. The method recited in claim 3, wherein said heat-setting said knitted fabric comprises passing said knitted fabric between a pair of hot rollers under an applied pressure.

5. The method recited in claim 3, wherein said heat-setting said knitted fabric is performed prior to said integrating said RFID inlay to each of said plurality of dipole antennas.

6. The method recited in claim 1, wherein said primary non-conductive fiber comprises polyester.

7. The method recited in claim 1, wherein said primary non-conductive fiber is a yarn.

8. The method recited in claim 1, wherein said secondary conductive fiber comprises aluminum.

9. The method recited in claim 1, wherein said RFID inlay comprises an RFID integrated circuit (IC) and a loop antenna on a substrate.

10. The method recited in claim 9, wherein said substrate comprises polyethylene terephthalate (PET).

11. The method recited in claim 10, wherein said PET substrate has a thickness of substantially 50 microns.

12. The method recited in claim 9, wherein said RFID inlay further comprises a moisture barrier layer and a heat resistant layer overlaying said RFID IC and said loop antenna.

13. The method recited in claim 12, wherein said moisture barrier comprises 100 micron cast polypropylene and said heat resistant layer comprises 25 micron polyimide.

14. The method recited in claim 9, wherein said loop antenna comprises aluminum.

15. The method recited in claim 9, wherein said integrating said RFID inlay with each of said plurality of dipole antennas comprises positioning said RFID inlay such that said loop antenna is inductively coupled to each of said plurality of dipole antennas.

16. The method recited in claim 1, wherein said integrating said RFID inlay with each of said plurality of dipole antennas comprises bonding said RFID inlay to said knitted fabric using an adhesive, sewing, micro-welding, or a combination thereof.

17. A fabric-based radio frequency identification (RFID) tag, comprising:
   a knitted fabric formed from a primary non-conductive fiber, a secondary conductive fiber and a tertiary fiber as a ribbon, said secondary conductive fiber being distributed within said knitted fabric to form a dipole antenna, said tertiary fiber defining a registration mark between an upper registration line and a lower registration line along said ribbon; and
   an RFID inlay integrated with said dipole antenna at said registration mark.

18. The RFID tag recited in claim 17, wherein said knitted fabric is a Raschel knit.

19. The RFID tag recited in claim 17, wherein said primary non-conductive fiber comprises polyester.

20. The RFID tag recited in claim 17, wherein said secondary conductive fiber comprises aluminum.

21. The RFID tag recited in claim 17, wherein said RFID inlay comprises an RFID integrated circuit (IC) and a loop antenna on a substrate.

22. The RFID tag recited in claim 21, wherein said substrate comprises polyethylene terephthalate (PET).

23. The RFID tag recited in claim 22, wherein said PET substrate has a thickness of substantially 50 microns.

24. The RFID tag recited in claim 21, wherein said RFID inlay further comprises a moisture barrier layer and a heat resistant layer overlaying said RFID IC and said loop antenna.

25. The RFID tag recited in claim 24, wherein said moisture barrier comprises 100 micron cast polypropylene and said heat resistant layer comprises 25 micron polyimide.

26. The RFID tag recited in claim 21, wherein said loop antenna comprises aluminum.

27. The RFID tag recited in claim 21, wherein said loop antenna is inductively coupled to said dipole antenna.

28. The RFID tag recited in claim 17, wherein said RFID inlay is integrated with said dipole antenna by bonding said RFID inlay to said knitted fabric using an adhesive, sewing, micro-welding, or a combination thereof.

* * * * *